(12) United States Patent
Gwak et al.

(10) Patent No.: US 12,444,589 B2
(45) Date of Patent: Oct. 14, 2025

(54) OPERATION METHOD OF ETCHING APPARATUS AND METHOD OF MANUFACTURING SEMICONDUCTOR DEVICE USING THE SAME

(71) Applicant: SAMSUNG ELECTRONICS CO., LTD., Suwon-si (KR)

(72) Inventors: Dooyoung Gwak, Suwon-si (KR); Soonam Park, Suwon-si (KR); Janggyoo Yang, Suwon-si (KR); Myungsun Choi, Suwon-si (KR); Jaemin Ha, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 417 days.

(21) Appl. No.: 18/123,068

(22) Filed: Mar. 17, 2023

(65) Prior Publication Data

US 2023/0307217 A1 Sep. 28, 2023

(30) Foreign Application Priority Data

Mar. 25, 2022 (KR) .................. 10-2022-0037503

(51) Int. Cl.
*H01L 21/311* (2006.01)
*H01J 37/32* (2006.01)
*H01L 21/66* (2006.01)

(52) U.S. Cl.
CPC .. *H01J 37/32862* (2013.01); *H01J 37/32743* (2013.01); *H01J 37/32788* (2013.01); *H01L 21/31116* (2013.01); *H01L 21/31144* (2013.01); *H01L 22/10* (2013.01); *H01J 2237/24485* (2013.01); *H01J 2237/3343* (2013.01)

(58) Field of Classification Search
None
See application file for complete search history.

(56) References Cited

U.S. PATENT DOCUMENTS

| 5,756,400 | A | 5/1998 | Ye et al. |
| 6,136,211 | A | 10/2000 | Qian et al. |
| 8,622,021 | B2 | 1/2014 | Taylor et al. |
| 9,017,486 | B2 | 4/2015 | Cheng et al. |
| 2006/0138085 | A1* | 6/2006 | Chien ............... H01L 21/02057 216/41 |

(Continued)

FOREIGN PATENT DOCUMENTS

| KR | 10-0530246 B1 | 11/2005 |
| KR | 10-1645043 B1 | 8/2016 |
| KR | 10-2021-0075961 A | 6/2021 |

*Primary Examiner* — Shamim Ahmed
(74) *Attorney, Agent, or Firm* — Sughrue Mion, PLLC

(57) ABSTRACT

An operation method of an etching apparatus includes transferring, from a load lock chamber to a process chamber, a substrate on which an etching target layer is formed, first etching the etching target layer on the substrate in a first etching time, transferring the substrate to a storage location in a state in a vacuum state, intermediate cleaning the process chamber in a first cleaning time, transferring the substrate from the storage location to the process chamber, second etching the etching target layer on the substrate in a second etching time, and returning the substrate to the load lock chamber. The etching target layer is formed in a predetermined etching pattern by the first etching and the second etching.

20 Claims, 11 Drawing Sheets

(56) References Cited

U.S. PATENT DOCUMENTS

| | | |
|---|---|---|
| 2008/0050922 A1 | 2/2008 | Tang et al. |
| 2010/0024840 A1 | 2/2010 | Hsieh et al. |
| 2016/0218012 A1* | 7/2016 | Shimamoto .......... H10D 30/024 |
| 2017/0047200 A1 | 2/2017 | Lee et al. |
| 2020/0140999 A1 | 5/2020 | Kwon et al. |
| 2020/0161162 A1 | 5/2020 | Yang et al. |
| 2020/0194242 A1 | 6/2020 | Zhou et al. |
| 2021/0233770 A1* | 7/2021 | Ren .................... C23C 14/0641 |

* cited by examiner

//  OPERATION METHOD OF ETCHING APPARATUS AND METHOD OF MANUFACTURING SEMICONDUCTOR DEVICE USING THE SAME

CROSS-REFERENCE TO RELATED APPLICATION

This application is based on and claims priority under from Korean Patent Application No. 10-2022-0037503, filed on Mar. 25, 2022, in the Korean Intellectual Property Office, the disclosure of which is incorporated by reference herein in its entirety.

BACKGROUND

1. Field

Example embodiments of the present disclosure relate to an operation method of an etching apparatus and a method of manufacturing a semiconductor device using the same, and more particularly, to an operation method of an etching apparatus using a segmented etching process and a method of manufacturing a semiconductor device using the same.

2. Description of Related Art

In the process of manufacturing a semiconductor device, a process of etching an etching target layer on a semiconductor substrate in a predetermined pattern is required. The etching process includes a dry etching process and a wet etching process, and a plasma etching process is a type of the dry etching process. The plasma etching process may be used to manufacture a semiconductor device in an etching apparatus. The etching apparatus may perform a plasma etching process on a semiconductor substrate by using plasma in a process chamber. When the plasma etching process is performed on the semiconductor substrate in the process chamber by using the etching apparatus, it is important to maintain etching uniformity by controlling plasma uniformity on the semiconductor substrate.

SUMMARY

Provided are an operation method of an etching apparatus using a segmented etching process and an intermediate cleaning process and a method of manufacturing a semiconductor device using the same, to thereby improve etching uniformity of etching an etching target layer in a predetermined pattern.

Additional aspects will be set forth in part in the description which follows and, in part, will be apparent from the description, or may be learned by practice of the presented embodiments.

According to an aspect of an example embodiment, an operation method of an etching apparatus may include transferring, from a load lock chamber to a process chamber, a substrate on which an etching target layer is formed, first etching the etching target layer on the substrate in a first etching time, transferring the substrate to a storage location in a state in a vacuum state, intermediate cleaning the process chamber in a first cleaning time, transferring the substrate from the storage location to the process chamber, second etching the etching target layer on the substrate in a second etching time, and returning the substrate to the load lock chamber. The etching target layer may be formed in a predetermined etching pattern by the first etching and the second etching.

According to an aspect of an example embodiment, an operation method of an etching apparatus may include transferring, from a load lock chamber to a first process chamber, a substrate on which an etching target layer is formed, first etching the etching target layer on the substrate in a first etching time in the first process chamber, transferring the substrate to a second process chamber adjacent to the first process chamber while a vacuum state is maintained, second etching the etching target layer on the substrate in a second etching time in the second process chamber, intermediate cleaning the first process chamber while the second etching is being performed, transferring the substrate to a third process chamber adjacent to the second process chamber while a vacuum is maintained, third etching the etching target layer on the substrate during a third etching time in the third process chamber, intermediate cleaning the second process chamber while the third etching is performed, and returning the substrate to the load lock chamber.

According to an aspect of an example embodiment, a method of manufacturing a semiconductor device may include forming an etching target layer on a substrate, forming a mask pattern on the etching target layer, forming an etching pattern by etching the etching target layer using the mask pattern as an etching mask, and removing the mask pattern. The forming the etching pattern may include transferring the substrate from a load lock chamber to a process chamber, first etching the etching target layer on the substrate in a first etching time, transferring the substrate to a storage location in a state in a vacuum state, intermediate cleaning the process chamber in a first cleaning time, transferring the substrate from the storage location to the process chamber, second etching the etching target layer on the substrate in a second etching time, and returning the substrate to the load lock chamber. The intermediate cleaning, the transferring of the substrate from the storage location to the process chamber, and the second etching may be repeated at least once until the etching target layer is etched in a predetermined etching pattern.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Hereinafter, embodiments of the disclosure will be described in detail with reference to the accompanying drawings.

For reference, the term "high aspect ratio" as used herein may refer to a ratio of depth to width (or a diameter) of about 10:1 or more, and the term "high selectivity" may refer to an etch selectivity of about 5:1 or more. In contrast, the term "low aspect ratio" may refer to a ratio of depth to width (or diameter) of less than about 10:1, and the term "low selectivity" may refer to an etch selection ratio of less than about 5:1.

Figure 1:
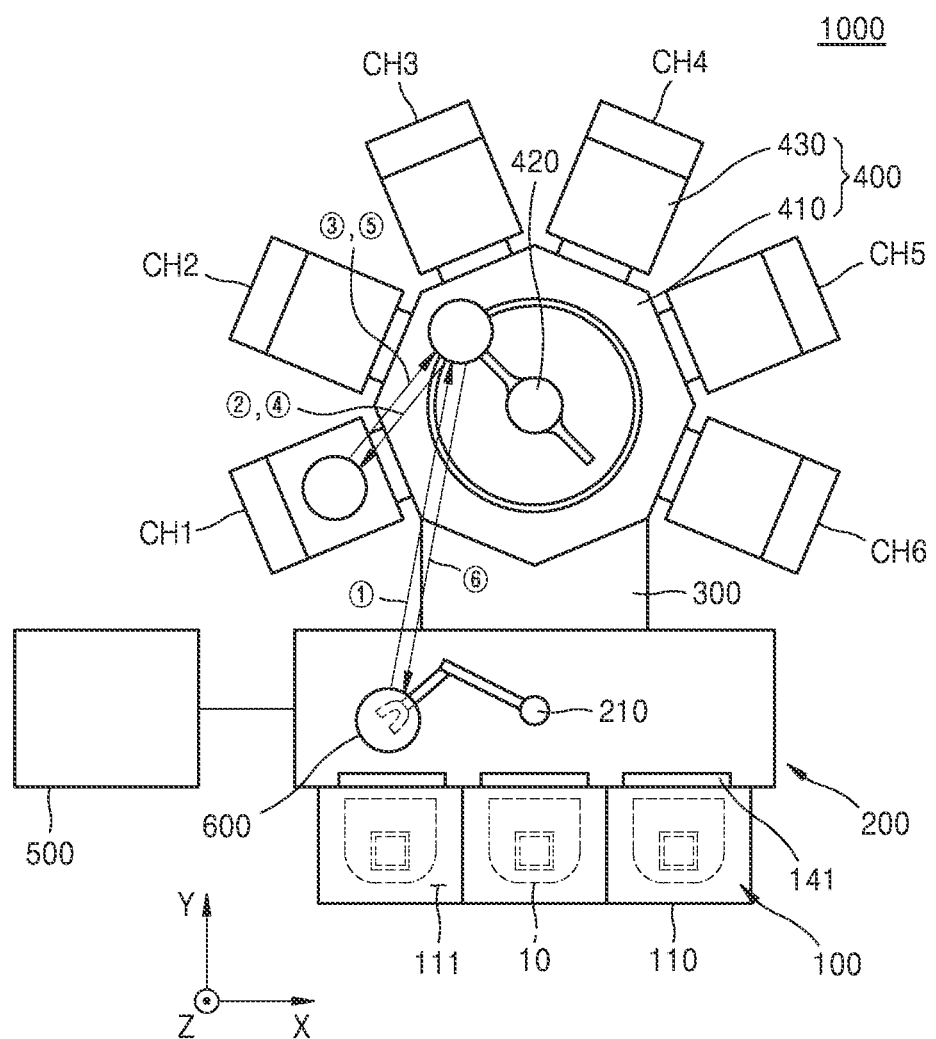
FIG. 1 is a diagram illustrating an etching apparatus according to an example embodiment of the disclosure.

FIG. 1 is a plan view schematically illustrating an etching apparatus according to an example embodiment of the disclosure.

Referring to FIG. 1, an etching apparatus 1000 may include a front end module 100, a transfer module 200, a load lock chamber 300, a manufacturing process facility 400, and a control server 500.

The front end module 100 may include a load port 110 providing an internal space 111 in which a substrate container 10 may be accommodated, and may adjust the internal space 111 of the load port 110 to vacuum pressure or atmospheric pressure.

The front end module 100 may fill the interior space 111 of the load port 110 and the inside of the substrate container 10 with nitrogen gas, inert gas, or clean dry air in order to boost the internal space 111 of the load port 110 and the inside of the substrate container 10 from vacuum pressure to atmospheric pressure.

The front end module 100 may maintain the internal space 111 at the vacuum pressure while the manufacturing process for a semiconductor substrate 600 is performed. In addition, the front end module 100 may forcibly exhaust a gas in the internal space 111 in order to reduce the internal space 111 of the load port 110 to the vacuum pressure from the atmospheric pressure.

In some embodiments, the front end module 100 may maintain the pressure of the inner space 111 at a pressure higher than the vacuum atmosphere in the manufacturing process facility 400 but lower than external pressure (e.g., atmospheric pressure) while the semiconductor manufacturing process is performed on the semiconductor substrate 600. Accordingly, the gas or moisture remaining in the substrate container 10 waiting in the front end module 100 and a plurality of semiconductor substrates 600 stored in the substrate container 10 may be removed.

Even though the pressure of the inner space 111 of the front end module 100 is not reduced to the vacuum atmosphere of the manufacturing process facility 400, the contamination of the substrate container 10 and the semiconductor substrate 600 may be sufficiently removed without lowering the productivity of the etching apparatus 1000 according to the process conditions.

The transfer module 200 may be arranged at a rear end of the front end module 100. The transfer module 200 may include a transfer robot 210 provided to freely rotate to load or unload the plurality of semiconductor substrates 600 received in the substrate container 10 waiting in the front end module 100. The transfer robot 210 of the transfer module 200 may transfer an unprocessed semiconductor substrate 600 in the substrate container 10 to the load lock chamber 300, and transfer, to the substrate container 10, the semiconductor substrate 600 waiting in the load lock chamber 300 after the manufacturing process has been completed in the manufacturing process facility 400.

In some embodiments, in order to prevent the semiconductor substrate 600 from being exposed to the outside and contaminated while the transfer robot 210 of the transfer module 200 transfers the semiconductor substrate 600, the transfer module 200 may maintain the inside of the transfer module 200 in a vacuum state. For example, the transfer module 200 may maintain the pressure of an internal sealable space in the transfer module 200 at the vacuum pressure.

Here, the front end module 100 may adjust the pressure in the load port 110 to be the same as an air pressure state of the transfer module 200 in order to prevent the air pressure state of the transfer module 200 from being changed at the time when a first door 141 is opened to transfer the semiconductor substrate 600.

The load lock chamber 300 may be arranged between the transfer module 200 and the manufacturing process facility 400. The load lock chamber 300 may adjust the internal pressure to the vacuum pressure to prevent a change in the air pressure state of the transfer module 200 and the transfer chamber 410 of the manufacturing process facility 400. A buffer chamber in which the semiconductor substrate 600 temporarily waits may be installed in the load lock chamber 300, and the semiconductor substrate 600 transferred from the transfer robot 210 of the transfer module 200 waits in the buffer chamber while the pressure of the load lock chamber 300 is adjusted.

When the transfer robot 210 of the transfer module 200 loads or unloads the semiconductor substrate 600, the load lock chamber 300 may form a vacuum atmosphere close to the transfer module 200 and receive an unprocessed semiconductor substrate 600 from the transfer robot 210 of the transfer module 200. In addition, when a robot arm 420 in the transfer chamber 410 of the manufacturing process facility 400 loads or unloads the semiconductor substrate 600, a vacuum atmosphere close to the transfer chamber 410 may be formed to receive, from the robot arm 420, the semiconductor substrate 600 that has completed the manufacturing process.

The manufacturing process facility 400 is arranged at a rear end of the load lock chamber 300, and may include the transfer chamber 410 and a plurality of process chambers 430. The manufacturing process facility 400 may include, but is not limited to, a dry etch facility and/or a cleaning facility.

The transfer chamber 410 may be arranged between the load lock chamber 300 and the process chamber 430. The transfer chamber 410 includes the robot arm 420 freely rotated, and may transfer the semiconductor substrate 600 waiting in the process chamber 430 and the load lock chamber 300.

The process chamber 430 may perform a semiconductor manufacturing process on the semiconductor substrate 600. An entrance gate may be installed between the process chamber 430 and the transfer chamber 410 to carry in or carry out the semiconductor substrate 600. The plurality of process chambers 430 may be installed along a respective side of the transfer chamber 410. The process chamber 430 may include first to sixth process chambers CH1 to CH6 in a clockwise direction. The six process chambers 430 are shown in the drawing, but the embodiments are not limited thereto.

The semiconductor substrate 600 on which the semiconductor manufacturing process is completed in the process chamber 430 may be transferred to the substrate container 10 waiting in the front end module 100 by the robot arm 420 of the transfer chamber 410. While the semiconductor substrate 600 is accommodated in the substrate container 10, the inside of the front end module 100 may be maintained in a vacuum state. Until the substrate container 10 is unloaded, the semiconductor substrate 600 on which the semiconductor manufacturing process is completed waits in the front end module 100 in the vacuum state, so that a gas or moisture remaining on the semiconductor substrate 600 may be removed.

In addition, since contaminants remaining in the semiconductor substrate 600 after completion of the semiconductor manufacturing process may be removed while waiting in the front end module 100, it is possible to prevent the unprocessed semiconductor substrate 600 stored in the substrate container 10 from being contaminated due to a corrosive gas emitted from the semiconductor substrate 600 in which the manufacturing process has been completed.

The control server 500 may include a device controller, a module controller, and a switching hub connecting the device controller to the module controller. Although the control server 500 is illustrated as being arranged on a side surface of the load lock chamber 300, the arrangement of the control server 500 is not limited thereto.

Figure 3:
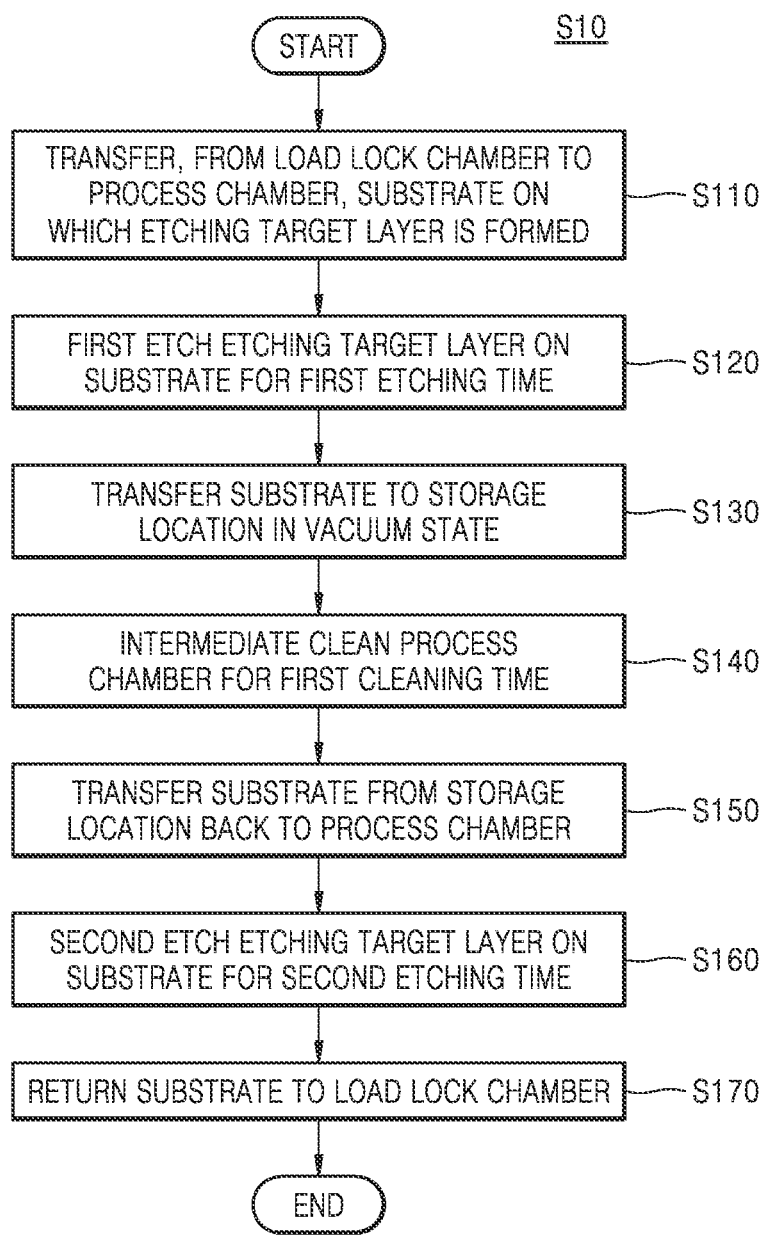
FIG. 3 is a flowchart illustrating an operation sequence of an etching apparatus according to an example embodiment of the disclosure.

The control server 500 transmits a control signal to each component of the etching apparatus 1000, based on a process recipe in which a control program and process processing condition data for realizing various processing of the semiconductor substrate 600 are recorded in which a semiconductor manufacturing process is performed on the semiconductor substrate 600, thereby being involved in the overall operation of the operation method of the etching apparatus (see S10 of FIG. 3). The details of the operation method of the etching apparatus (see S10 of FIG. 3) will be described later.

In addition, the semiconductor substrate 600 processed by the etching apparatus 1000 may include representatively a silicon (Si) wafer for manufacturing a semiconductor device. In addition to the illustrated configuration of the etching apparatus 1000, a plurality of systems may be required to perform a manufacturing process required for complete manufacture of a semiconductor integrated circuit or a semiconductor chip. Here, for clarity of the disclosure, conventional configurations or configurations that may be understood at the level of one of ordinary skill in the art will be omitted.

As miniaturized, multifunctional, and high performance electronic products are required, high-capacity semiconductor devices are required, and an increased degree of integration is required to provide high-capacity semiconductor devices. As described above, as the degree of integration of semiconductor devices increases, design rules for components of a semiconductor device are decreasing, and contact holes having a high aspect ratio are required. However, in the manufacturing process of a highly reduced semiconductor device, etching nonuniformity occurs, and thus it becomes increasingly complicated and difficult to form a contact hole having a high aspect ratio.

In general, an etching process for forming a contact hole having a high aspect ratio generates a large amount of $C_xF_y$-based polymer, thereby being sensitive to an internal temperature of the process chamber 430 and an internal surface state during the etching process. When the $C_xF_y$-based polymer deposited on the inner surface of the process chamber 430 during the etching process is excessive, a process defect may occur due to particle contamination and micro-arcing problems may be caused due to polymer charging on the surface of the semiconductor substrate 600. In addition, even in the interface region between components in the process chamber 430 during the etching process, the arcing problems caused by the $C_xF_y$-based polymer deposition continuously occur.

Accordingly, due to a change in the amount of polymer deposition in the process chamber 430 during performance of a long time etching process, a relative polymer shortage (i.e., an over-clean state) may be caused in an initial state of the etching process, and an etching performance may be degraded due to a relative polymer excess (i.e., a contamination state) in a later state of the etching process.

In addition, in order to remove the excessively deposited polymer inside the process chamber 430 due to a long-term etching process, an in-situ cleaning process of a long time should be necessarily applied. The etching process is not performed in the process chamber 430 in which the in-situ cleaning of the long time is performed, which may result in a rapid decrease in the productivity of the process of forming the contact hole of the high aspect ratio.

Therefore, it is necessary to ensure a method of overcoming various problems and degradation of the etching process characteristics, which are caused by the progress of the long-term etching process with respect to the etching process that forms a contact hole of a high aspect ratio.

In order to address these problems, the etching apparatus 1000 according to an embodiment of the disclosure may perform an etching process by: ① a first process of transferring, from the load lock chamber 300 to the transfer chamber 410, the semiconductor substrate 600 on which the etching target layer is formed; ② a second process of transferring the semiconductor substrate 600 from the transfer chamber 410 to the process chamber 430 and first etching the etching target layer on the semiconductor substrate 600 during a first etching time; ③ a third process of transferring the semiconductor substrate 600 to the transfer chamber 410 in a vacuum state and intermediate cleaning of the process chamber 430 during a first cleaning time; ④ a fourth process of transferring the semiconductor substrate 600 from the transfer chamber 410 back to the process chamber 430 and etching the etching target layer on the semiconductor substrate 600 during a second etching time; ⑤ a fifth process of transferring the semiconductor substrate 600 to the transfer chamber 410; and ⑥ a sixth process of transferring the semiconductor substrate 600 to the load lock chamber 300, which are segmented from the etching process.

That is, the operation method of the etching apparatus 1000 according to an embodiment of the disclosure is configured to perform intermediate cleaning of the process chamber 430 between one segmented etching process and another segmented etching process in order to minimize a state change accumulation in the process chamber 430 during the etching process. As described above, it is possible to remove contaminants (i.e., polymers) that affect the etching quality through intermediate cleaning of the process chamber 430 stepwise, before being excessively accumulated.

In other words, in the etching process, a resetting concept (i.e., intermediate cleaning) is introduced to prevent rapid changes in the internal environment of the process chamber 430 and maintain a constant state, and after performing the etching process for a predetermined unit time, the etching process is stopped for a while and the intermediate cleaning of the process chamber 430 is performed, to thus reduce contaminants in the process chamber 430 and maintain the chemical composition uniformly. This is a precautionary preemptive contaminant reduction action, and the quality of the semiconductor device may be expected to be improved by increasing the etching uniformity.

Here, the first etching time, the second etching time, and the first cleaning time may be defined based on the intensity of a time series signal analyzed by an optical emission spectroscopy (OES) sensor arranged in the process chamber 430. Details thereof will be described later. The first etching and the second etching may include a plasma etching process using substantially the same process gas. The number of segments of the etching process may be adjusted to one or more times until the etching target layer on the semiconductor substrate 600 is etched in a desired etching pattern.

Figure 2:
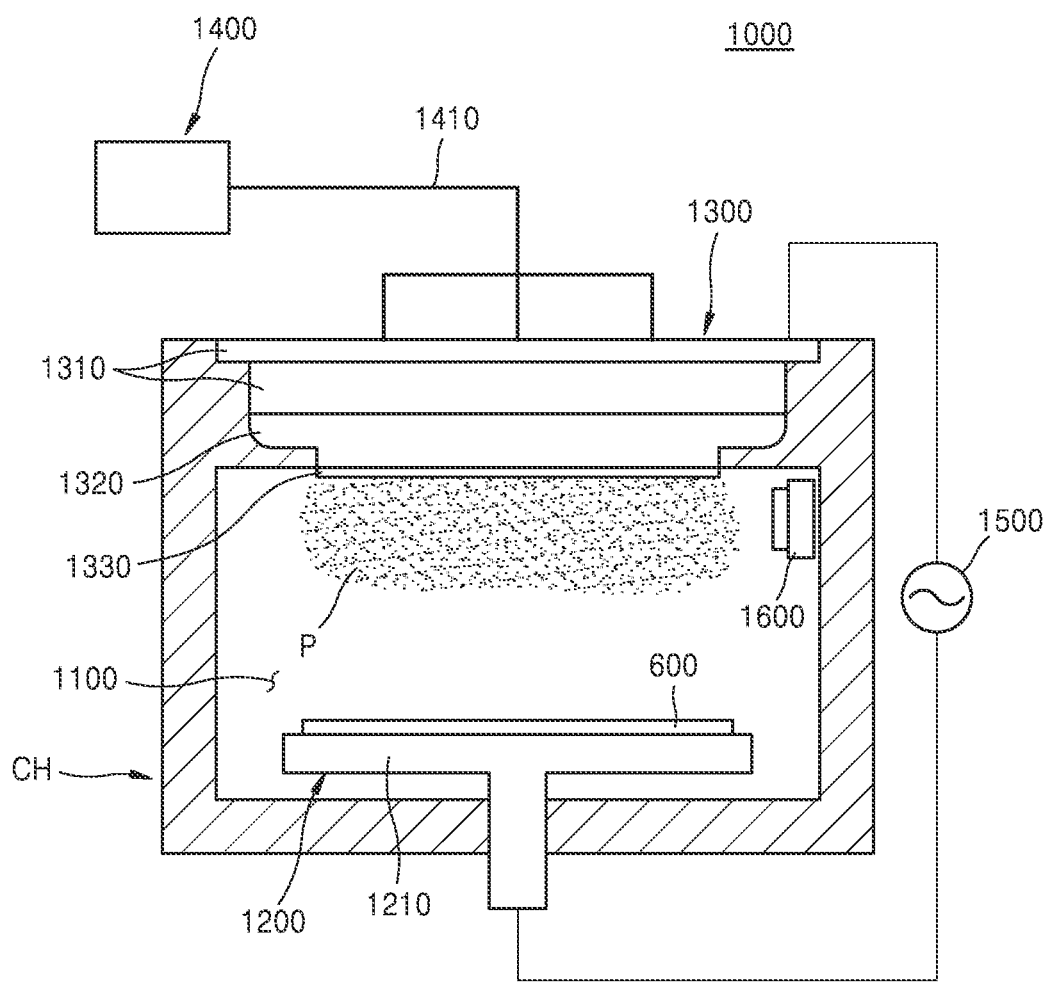
FIG. 2 is a diagram illustrating a process chamber of an etching apparatus according to an example embodiment of the disclosure.

FIG. 2 is a diagram illustrating a process chamber of an etching apparatus according to an example embodiment of the disclosure. FIG. 2 illustrates a process chamber CH of the etching apparatus 1000 used to form a thin film on a semiconductor substrate 600.

The etching apparatus 1000 may include the process chamber CH, a substrate support unit 1200 arranged in a lower portion of the process chamber CH, and a gas supply unit 1300 arranged in an upper portion of the process chamber CH.

The process chamber CH has an internal region 1100 having a predetermined size and may be formed of a material having excellent wear resistance and corrosion resistance. The process chamber CH may be referred to as a chamber housing.

The process chamber CH may be formed of, for example, an aluminum block. The process chamber CH may maintain the internal region 1100 in a sealed or vacuum state in a plasma treatment process (e.g., an etching process using plasma). The process chamber CH may include a part of the etching apparatus 1000 including a plurality of process chambers.

The substrate support unit 1200 may be arranged in a lower portion of the internal region 1100 of the process chamber CH. The substrate support unit 1200 may include a support table 1210. A semiconductor substrate 600 to be processed may be arranged on the upper surface of the support table 1210.

The substrate support unit 1200 serves as a substrate support member capable of supporting the semiconductor substrate 600. The substrate support unit 1200 fixes and supports the semiconductor substrate 600 during the etching process. The substrate support unit 1200 may be formed by a combination of aluminum and ceramic, and may include a conductive portion capable of receiving an electrostatic force from an electrostatic force supply source and an uneven protrusion having a polarity and a concave-convex shape.

When electrostatic force is applied between the semiconductor substrate 600 and a support table 1210 using bipolar electrostatic force supplied from the electrostatic power source, the semiconductor substrate 600 may be stably fixed to the support table 1210 during an etching process. The uneven protrusion may be arranged on the support table 1210 and may fix the semiconductor substrate 600 with bipolar electrostatic force. However, the substrate support unit 1200 is not limited to this structure, and for example, the substrate support unit 1200 may fix the semiconductor substrate 600 in various methods, such as mechanical clamping.

The gas supply unit 1300 may include a gas introduction unit 1310, a gas distribution plate 1320, and a shower head 1330. The gas supply unit 1300 may be spaced apart at a predetermined interval at a position facing the substrate support unit 1200 and may be in an upper portion of the process chamber CH. The gas supply unit 1300 may be connected to a gas supply source 1400 through a gas supply pipe 1410, and the gas supply source 1400 may supply a process gas to the internal region 1100 through the gas supply unit 1300.

The gas supply source 1400 may be connected to the gas supply unit 1300 through the gas supply pipe 1410. The gas supply pipe 1410 may include a valve (not shown) for supplying the process gas from the gas supply source 1400 to the gas supply unit 1300 and converting a gas flow. The process gas may include, for example, a fluorine (F)-based gas, but is not limited thereto.

The gas supply source 1400 may be controlled by a gas controller. That is, the gas control unit may control the gas supply source 1400 to thereby control the type of gas, a supply time/end point of the gas, a flow rate of the gas, and the like, which is supplied to the gas supply unit 1300.

A power supply unit 1500 may be connected to the gas supply unit 1300 (where the gas supply unit 1300 functions as an upper electrode) and the substrate support unit 1200, (where it functions as a lower electrode), and plasma P may be generated in the internal region 1100 between the gas supply unit 1300 and the substrate support unit 1200 by using power supplied from the power supply unit 1500.

For example, the power supply unit 1500 may apply high frequency power of about 60 MHz through the gas supply unit 1300 (functioning as an upper electrode), and may apply high frequency power of about 2 MHz through the substrate support unit 1200 facing the gas supply unit 1300 (functioning as a lower electrode).

The process of generating the plasma P will be briefly described as follows. When the process gas is supplied to the internal region 1100 through the gas supply unit 1300 from the gas supply source 1400 arranged outside the process chamber CH, power formed by the power supply unit 1500 converts the process gas into plasma P.

Accordingly, the plasma P is sprayed to the semiconductor substrate 600 on the substrate support unit 1200 arranged in the lower portion of the internal region 1100 of the process chamber. The plasma P is formed of ions and/or radicals (hereinafter, collectively referred to as ions) of the process gas and serves as etching plasma P for etching the etching target layer formed on the semiconductor substrate 600. The gas supply unit 1300 may induce the ions to be distributed in the upper space of the semiconductor substrate 600 at a uniform density, thereby forming a plasma sheath having a uniform density on the semiconductor substrate 600. Accordingly, a uniform etching process may be performed over a whole surface of the semiconductor substrate 600.

In addition to the components shown above, the etching apparatus 1000 may further include a temperature controller for maintaining a constant temperature of the semiconductor substrate 600 and the internal region 1100 of the process chamber CH, and an exhaust for discharging a reaction by-product or a residual process gas of the etching process, during performance of a plasma etching process for the semiconductor substrate 600.

The semiconductor substrate 600 to be processed by the etching apparatus 1000 may have an active surface on which a semiconductor device is formed and an inactive surface facing the active surface. The active surface corresponds to a front-side surface of the semiconductor substrate 600, and the inactive surface corresponds to a back-side surface of the semiconductor substrate 600. In addition, the semiconductor substrate 600 may include a wafer and on an active surface of the wafer, a material layer for forming a device.

In the process of manufacturing a semiconductor device, an etching process of removing an etching target layer on a semiconductor substrate 600 in a predetermined pattern is required. The etching process includes a dry etching process and a wet etching process, and a plasma etching process using plasma P is a type of the dry etching process. The etching process using plasma P is characterized in that the etching target layer to be etched on the semiconductor substrate 600 is anisotropically etched using the plasma P formed by spraying the process gas to the internal region 1100 of the process chamber CH through the gas supply unit 1300.

An OES sensor 1600 may be arranged in the internal region 1100 of the process chamber CH. The OES sensor 1600 may measure an intensity of a specific wavelength generated in the plasma P. That is, information on the deposition state of a polymer material in the internal region 1100 may be indirectly confirmed based on the intensity of a time series signal having a predetermined wavelength analyzed by the OES sensor 1600. As described above, according to the state of the internal region 1100 of the process chamber CH, which is measured by the OES sensor 1600, it is possible to determine whether or not the etching process is segmented and the intermediate cleaning is performed.

FIG. 3 is a flowchart illustrating an operation sequence of an etching apparatus according to an example embodiment of the disclosure.

Referring to FIG. 3, an operation method S10 of the etching apparatus may include a process sequence of first to seventh operations S110 to S170.

When an embodiment is implemented differently, a specific process sequence may be performed differently from the sequence described above. For example, two processes described in succession may be performed substantially simultaneously, or in the opposite sequence to the described sequence.

The operation method S10 of an etching apparatus according to an disclosure may include transferring, from a load lock chamber to a process chamber, a substrate on which an etching target layer is formed in operation S110, first etching the etching target layer on the substrate during a first etching time in operation S120, transferring the substrate to a storage location in a state in which a vacuum is maintained in operation S130, intermediate cleaning the process chamber during a first cleaning time in operation S140, transferring the substrate from the storage location back to the process chamber in operation S150, second etching the etching target layer on the substrate during a second etching time in operation S160, and returning the substrate to the load lock chamber in operation S170.

Here, operation S120 of the first etching and operation S160 of the second etching refer to operations of performing one etching process by two segmented etching processes in order to form the etching target layer in a desired etching pattern.

In addition, until the etching target layer is etched to include a high aspect ratio contact hole, which is a desired etching pattern, operation S140 of the intermediate cleaning to operation S160 of the second etching may be repeated once or more times. In other words, one etching process may be performed by two or more segmented etching processes.

As described above, operation S140 of intermediate cleaning is performed between operation S120 of the first etching and operation S160 of the second etching, thereby reducing contaminants inside the process chamber and uniformly maintaining chemical composition during the entire etching process. The segmented etching process and the intermediate cleaning process are the same as described above, which can improve the quality of the semiconductor device by increasing the etching uniformity by a precautionary preemptive action of reducing the contaminant material.

Figure 4A:
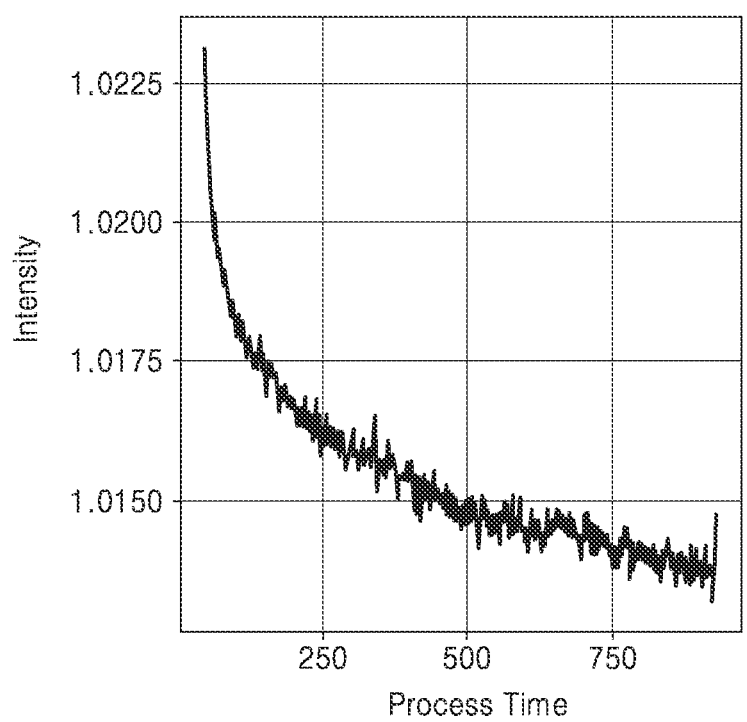
FIGS. 4A and 4B are graphs illustrating the intensity of a time series signal in a process chamber of an etching apparatus according to an example embodiment of the disclosure.
Figure 4B:
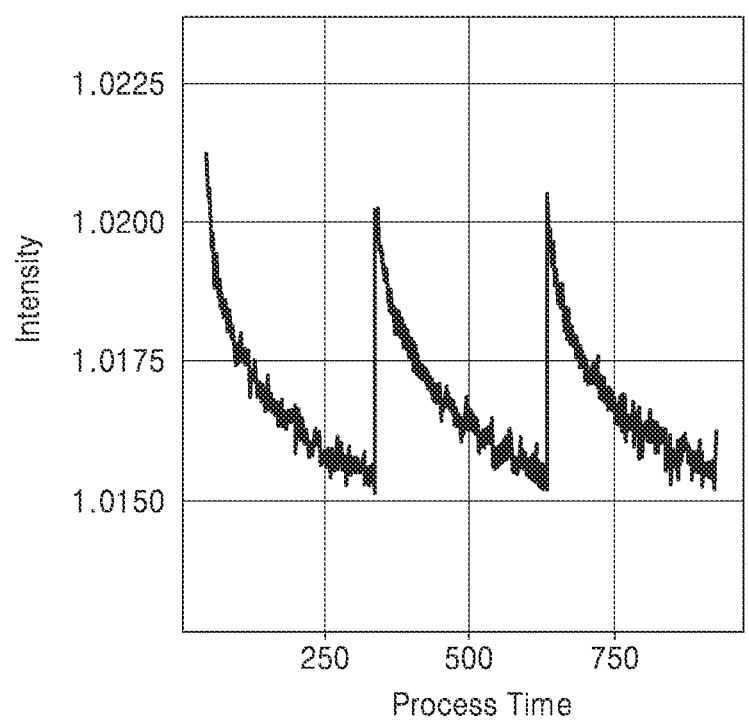

FIGS. 4A and 4B are graphs schematically illustrating the intensity of a time series signal in a process chamber of an etching apparatus according to an embodiment of the disclosure.

Referring to FIGS. 4A and 4B, the intensity of a time series signal of a material emitting a wavelength of about 370 nm as an etching process proceeds is shown.

As shown in FIG. 4A, when one etching process is continuously performed in one process chamber without segmentation, it can be seen that a wavelength intensity of about 370 nm decreases on a logarithmic scale over time, compared to the initial stage. It may be inferred that the $C_xF_y$-based polymer deposited on the surface of the process chamber during the etching process continuously increases.

As shown in FIG. 4B, when one etching process is performed in one process chamber by three etching processes (i.e., two intermediate cleaning processes), it can be seen that a wavelength intensity of about 370 nm decreases on a logarithmic scale over time, compared to an initial value, and then the intensity is reset to an initial value after performing the intermediate cleaning processes. It may be inferred that the $C_xF_y$-based polymer deposited on the surface of the process chamber during the etching process does not increase above a certain level.

In other words, the etching is performed until the time point where the absolute value change rate of about 10% to about 50% is detected with respect to the initial intensity of the specific wavelength, and the intermediate cleaning of the process chamber is performed after transferring the semiconductor substrate to the storage location, to thereby keep the inner environment of the process chamber constant. In this manner, by the intermediate cleaning of the process chamber at least once in the middle of the etching process, when a high aspect ratio contact hole is formed in an environment maintained uniform, a result of further ensuring etching uniformity may be obtained.

In FIG. 4B, three segmented etching processes (i.e., two intermediate cleaning processes) are illustrated, but the embodiments are not limited thereto. That is, the high aspect ratio contact hole may be formed through an etching process, which is divided into two segmented etching processes (i.e., one intermediate cleaning process) or four or more segmented etching processes (i.e., three or more intermediate cleaning processes).

Figure 5:
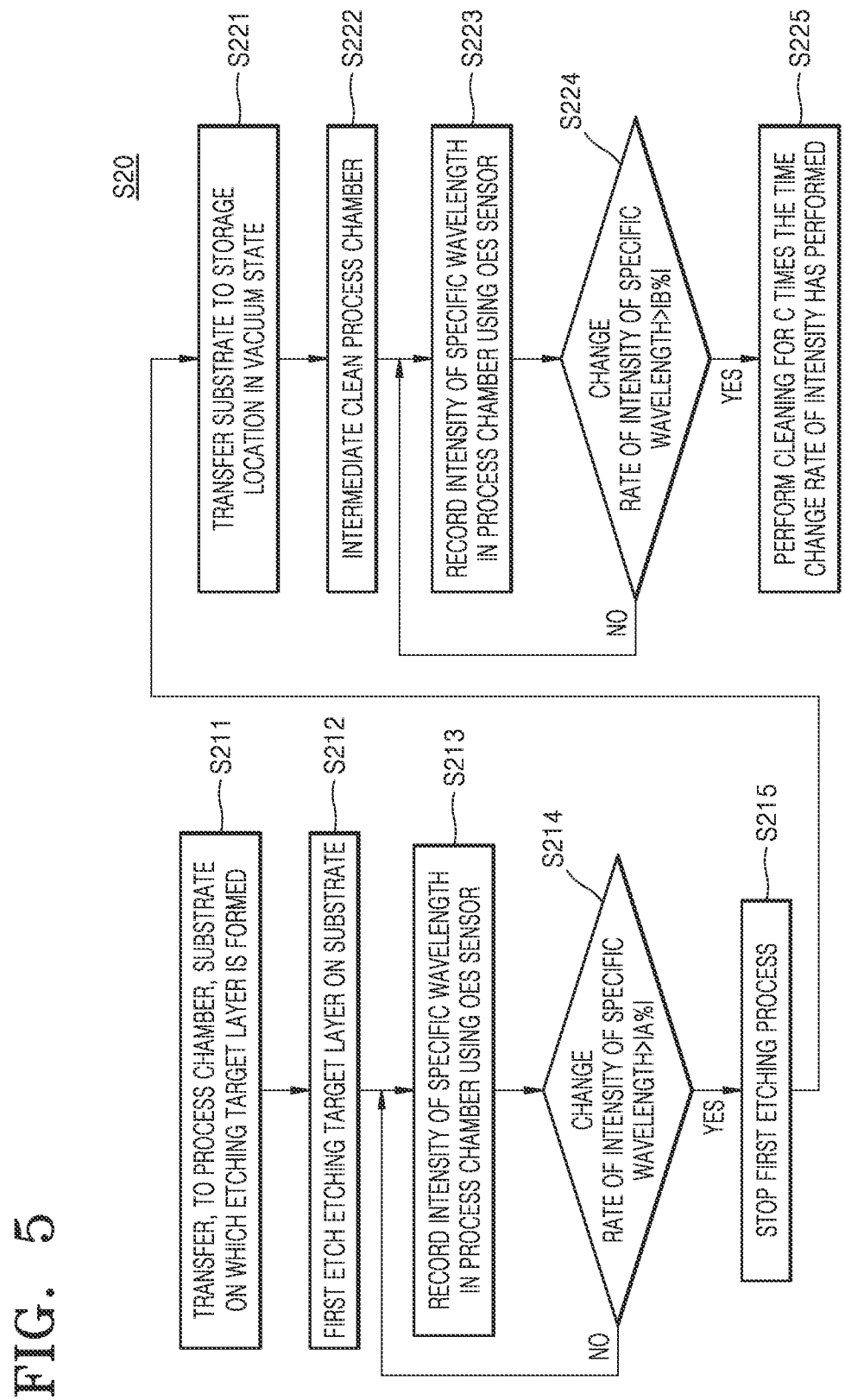
FIG. 5 is a flowchart illustrating an operation sequence of an etching apparatus according to an example embodiment of the disclosure.

FIG. 5 is a flowchart illustrating an operation sequence of an etching apparatus according to an example embodiment of the disclosure.

Referring to FIG. 5, an operation method S20 of the etching apparatus may include a process sequence of operations S211 to S215 and S221 to S225.

The operation method S20 of the etching apparatus according to an embodiment of the disclosure may be largely divided into operations steps S211 to S215 and operations S221 to S225. Specifically, operations S211 to S215 show a process of determining a point in time at which the etching should be stopped during the etching process, and operations S221 to S225 show a process of determining the cleaning time during the intermediate cleaning process.

The operation method S20 of an etching apparatus according to an disclosure may include transferring, to a process chamber, a substrate on which an etching target layer is formed in operation S211, first etching the etching target layer on the substrate in operation S212, recording the intensity of a specific wavelength in the process chamber by using an OES sensor in operation S213, determining whether the specific wavelength intensity is detected to be greater than an absolute value change rate of A % (e.g., about 10% to about 50%), compared to an initial intensity in operation S214, stopping the first etching process in operation S215, transferring the substrate to a storage location in a state in which a vacuum is maintained in operation S221, intermediate cleaning the process chamber in operation S222, recording the intensity of a specific wavelength in the process chamber by using the OES sensor in operation S223, determining whether the rate of change in the specific wavelength intensity is detected to be less than the absolute value change rate of B % (e.g., about 10% to about 30%) in operation S224, and performing intermediate cleaning of the process chamber for a time of C times (e.g., about 1 to about 3 times) of the time to reach the absolute value change rate in operation S225.

Here, the numerical value corresponding to each of the A, B, and C is a variable that may vary depending on the characteristics of the etching target layer to be etched. Information on the deposition state of a polymer material in the internal region 1100 of the process chamber may be indirectly confirmed based on the intensity of a time series signal having a predetermined wavelength analyzed by the OES sensor. As described above, it is possible to determine whether the etching process is segmented and the intermediate cleaning time is appropriate according to the state of the internal region of the process chamber measured by the OES sensor.

For example, by analyzing the intensity of a specific wavelength in which the signal intensity decreases according to the intermediate cleaning time in the OES sensor, the intermediate cleaning may be performed for a time of about 1 to about 3 times the time of reaching the signal intensity of about 10% to about 30% with respect to the initial intensity of the specific wavelength. In some example embodiments, the intermediate cleaning may be performed for a time that is greater than or equal to the time it takes the signal intensity of the specific wavelength to reach an signal intensity of about 10% to about 30% with respect to the initial intensity of the specific wavelength.

Figure 6:
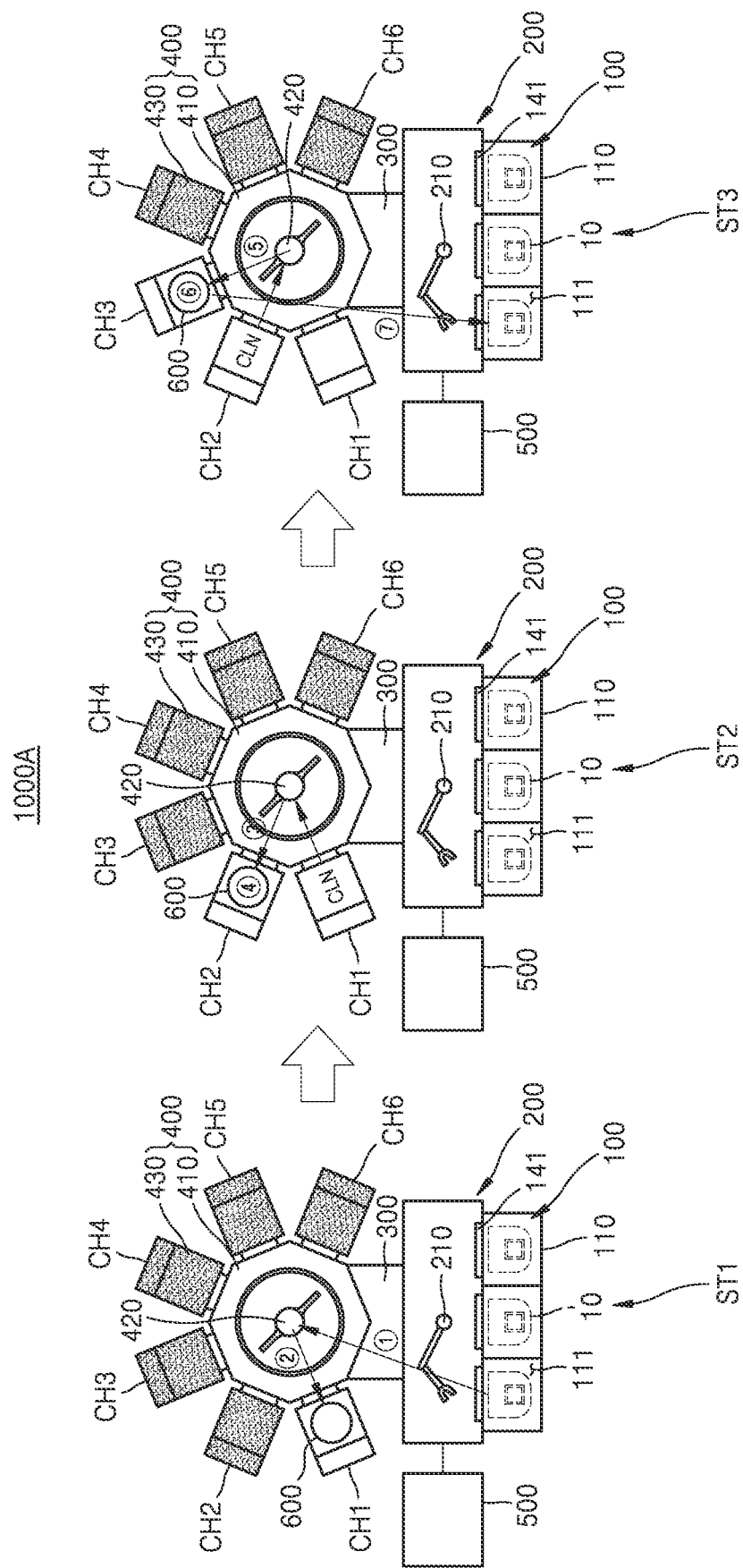
FIG. 6 is a diagram illustrating an operation method of an etching apparatus according to an example embodiment of the disclosure.

FIG. 6 is a diagram illustrating an operation method of an etching apparatus according to an example embodiment of the disclosure.

Most of the components of an etching apparatus 1000A to be described below are substantially the same as or similar to those described above with reference to FIG. 1. Therefore, for convenience of explanation, the etching apparatus 1000A will be described with reference to the etching apparatus 1000 described above.

Referring to FIG. 6, the etching apparatus 1000A includes a manufacturing process facility 400 having a plurality of process chambers 430, and a control server 500 for controlling the manufacturing process facility 400, and providing operation information on a transfer order of the semiconductor substrate 600 from the control server 500 to the manufacturing process facility 400.

The operation from the time when the semiconductor substrate 600 is introduced into the process chamber 430 to undergo a predetermined etching process, and to the time when the semiconductor substrate 600 is withdrawn from the process chamber 430 may be defined as one process cycle. In addition, the process chamber 430 may include first to sixth process chambers CH1 to CH6 in a clockwise direction. The six process chambers 430 are shown in FIG. 6, but the embodiments are not limited thereto.

The etching apparatus 1000A includes, in a sequence, the operation methods of the first process chamber CH1 performing an etching process cycle segmented by a first etching order ST1 in the control server 500, the second process chamber CH2 performing an etching process cycle segmented by a second etching order ST2, and the third process chamber CH3 performing an etching process cycle segmented by a third etching order ST3.

Specifically, the etching apparatus 1000A performs an etching process including: ① a first process of transferring, from the load lock chamber 300 to t first process chamber CH1, a semiconductor substrate 600 on which an etching target layer is formed; ② a second process of first etching the etching target layer on the semiconductor substrate 600 in the first process chamber CH1 during a first etching time; ③ a third process of transferring the semiconductor substrate 600 to a second process chamber CH2 adjacent to the first process chamber CH1 in a state in which vacuum is maintained; ④ a fourth process of second etching the etching target layer on the semiconductor substrate 600 in the second process chamber CH2 for a second etching time, and simultaneously, performing intermediate cleaning CLN of the first process chamber CH1; ⑤ a fifth process of transferring the semiconductor substrate 600 to a third process chamber CH3 adjacent to the second process chamber CH2 in a state in which vacuum is maintained; ⑥ a sixth process of third etching the etching target layer on the semiconductor substrate 600 in the third process chamber CH3 for a third etching time, and simultaneously, performing intermediate cleaning CLN of the second process chamber CH2; and ⑦ a sixth process of returning the semiconductor substrate 600 to the load lock chamber 300.

At least three segmented etching processes performed in each of the first to third process chambers CH1, CH2, and CH3 may include plasma dry etching using substantially the same process gas. In addition, the first to third etching may be an etching process for a high aspect ratio contact hole for forming the etching target layer in an etching pattern of a desired shape.

Here, time points at which the semiconductor substrate 600 is transferred to different process chambers may be defined based the intensity of a time series signal analyzed by the OES sensor, as described above. A subsequent new semiconductor substrate may be transferred to the first process chamber CH1 in which the intermediate cleaning CLN is completed to undergo a new etching process cycle.

A detailed order of the operation method of the etching apparatus (see S30 and S40 of FIGS. 7 and 8) using a plurality of process chambers will be described later.

Figure 7:
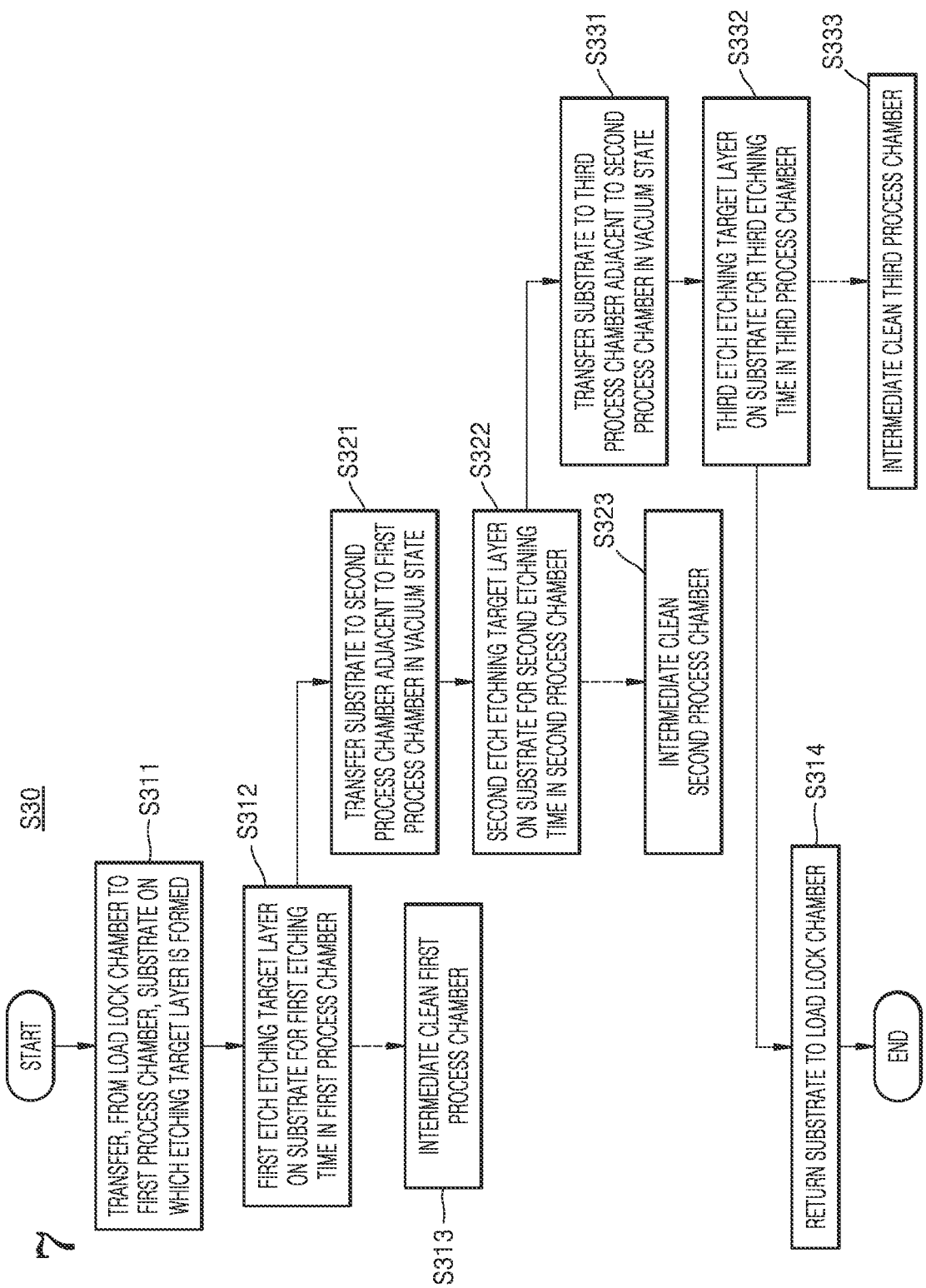
FIG. 7 is a flowchart illustrating an operation sequence of an etching apparatus according to an example embodiment of the disclosure.

FIG. 7 is a flowchart illustrating an operation sequence of an etching apparatus according to an example embodiment of the disclosure.

Referring to FIG. 7, an operation method S30 of the etching apparatus may include a process sequence of operations S311 to S314, S321 to S323 and S331 to S333.

When an embodiment is implemented differently, a specific process sequence may be performed differently from the sequence described above. For example, two processes described in succession may be performed substantially simultaneously, or in the opposite sequence to the described sequence.

The operation method S30 of an etching apparatus according to an disclosure may include transferring, from a load lock chamber to a first process chamber, a substrate on which an etching target layer is formed in operation S311, first etching the etching target layer on the substrate during a first etching time in the first process chamber in operation S312, intermediate cleaning the first process chamber in operation S313, transferring the substrate to a second process chamber adjacent to the first process chamber while the vacuum is maintained in operation S321, second etching the etching target layer on the substrate during the second etching time in the second process chamber in operation S322, intermediate cleaning the second process chamber in operation S323, transferring the substrate to a third process chamber adjacent to the second process chamber while the vacuum is maintained in operation S331, third etching the etching target layer on the substrate during a third etching time in the third process chamber in operation S332, intermediate cleaning the third process chamber in operation S333, and returning the substrate to the load lock chamber in operation S314.

Figure 8:
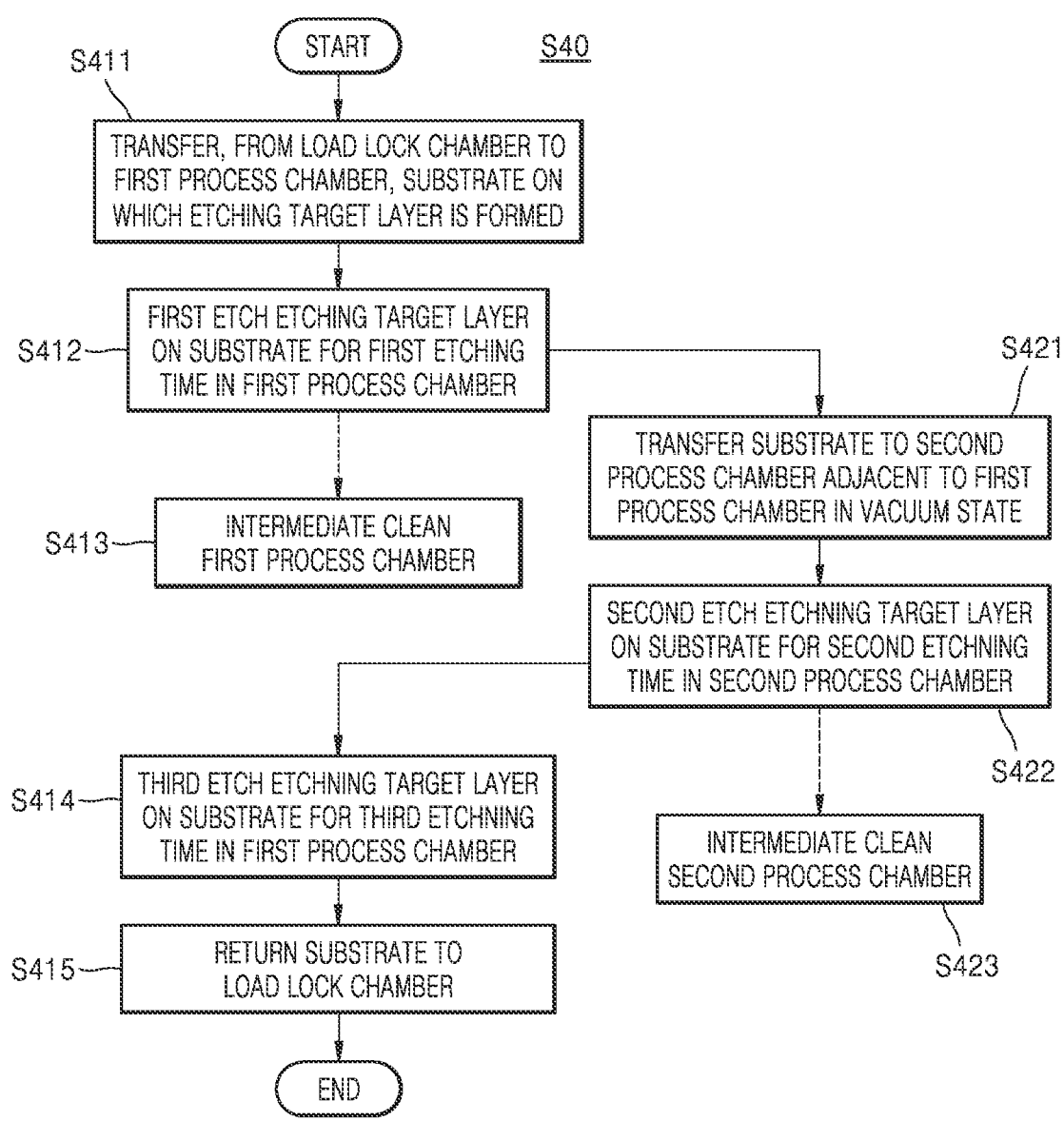
FIG. 8 is a flowchart illustrating an operation sequence of an etching apparatus according to an example embodiment of the disclosure.

FIG. 8 is a flowchart illustrating an operation sequence of an etching apparatus according to an example embodiment of the disclosure.

Referring to FIG. 8, an operation method S40 of the etching apparatus may include a process sequence of operations S411 to S415 and S421 to S423.

When an embodiment is implemented differently, a specific process sequence may be performed differently from the sequence described above. For example, two processes described in succession may be performed substantially simultaneously, or in the opposite sequence to the described sequence.

An operation method S40 of an etching apparatus according to an disclosure may include transferring, from a load lock chamber to a first process chamber, a substrate on which an etching target layer is formed in operation S411, first etching the etching target layer on the substrate during a first etching time in the first process chamber in operation S412, intermediate cleaning the first process chamber in operation S413, transferring the substrate to a second process chamber adjacent to the first process chamber while the vacuum is maintained in operation S421, second etching the etching target layer on the substrate during a second etching time in the second process chamber in operation S422, intermediate cleaning the second process chamber in operation S423, third etching the etching target layer on the substrate during a third etching time in the first process chamber in operation S414, and returning the substrate to the load lock chamber in operation S415.

Figure 9:
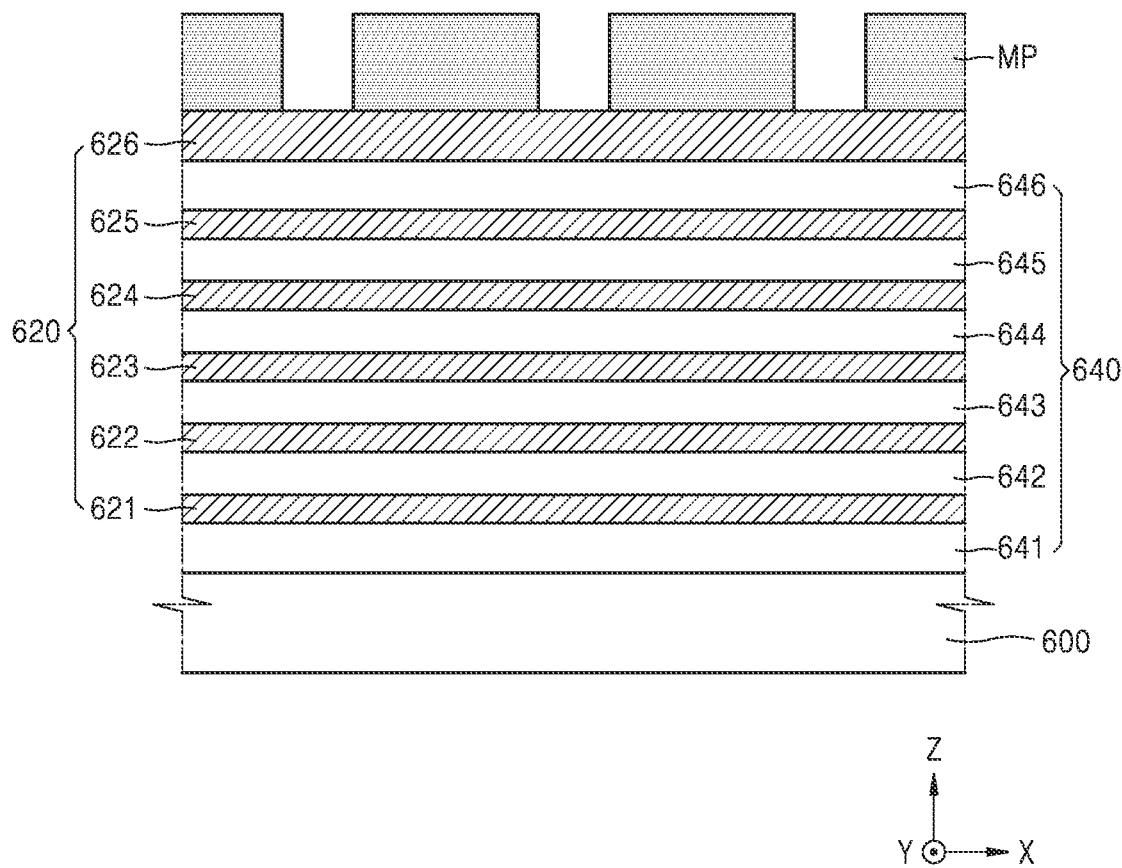
FIGS. 9 and 10 are diagrams illustrating a process of manufacturing a semiconductor device using an etching apparatus according to an example embodiment of the disclosure.
Figure 10:
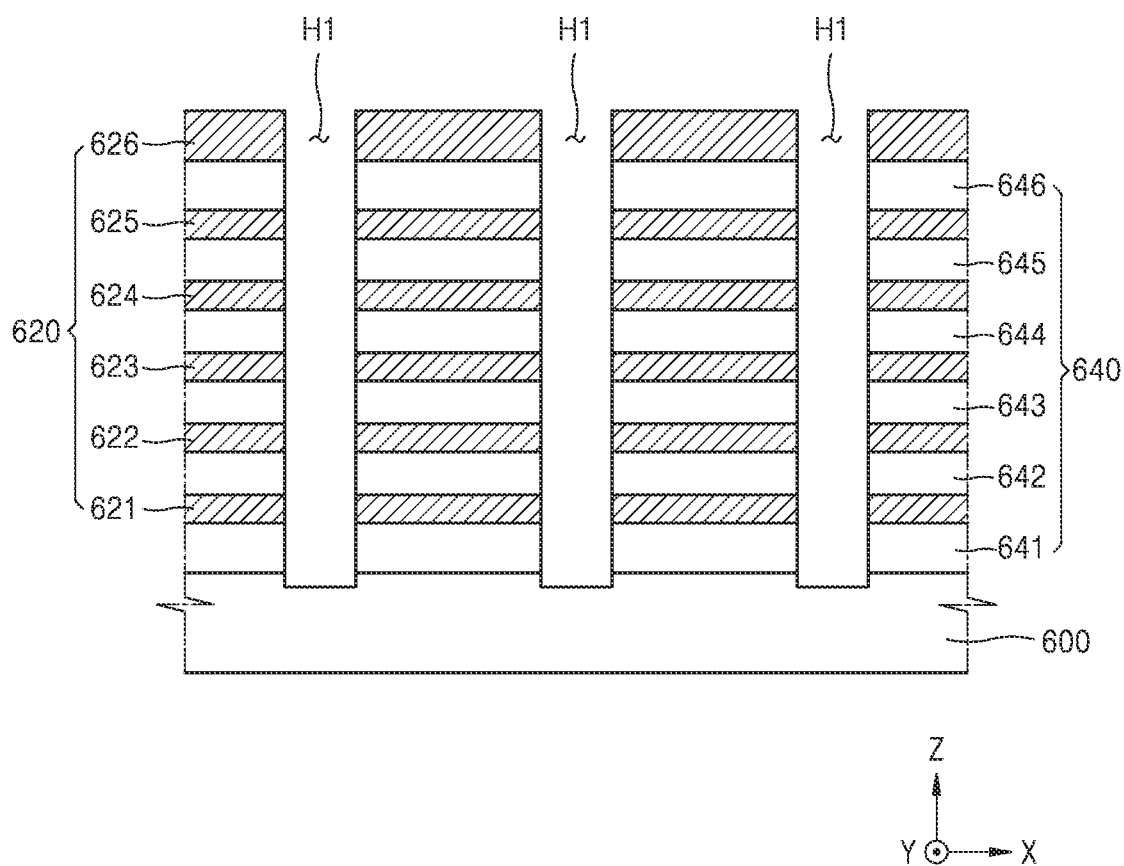

FIGS. 9 and 10 are diagrams illustrating a process of manufacturing a semiconductor device using an etching apparatus according to an example embodiment of the disclosure.

Referring to FIG. 9, interlayer insulating layers 620 and sacrificial layers 640 may be alternately formed on the semiconductor substrate 600 using the etching apparatus 1000 (see FIG. 1) according to an embodiment of the disclosure.

The semiconductor substrate 600 may include, for example, silicon (Si). Alternatively, the semiconductor substrate 600 may include a semiconductor element, such as germanium (Ge), or a compound semiconductor, such as silicon carbide (SiC), gallium arsenide (GaAs), indium arsenide (InAs), and indium phosphate (InP). Alternatively, the semiconductor substrate 600 may have a silicon on insulator (SOI) structure. For example, the semiconductor substrate 600 may include a buried oxide (BOX) layer. In addition, the semiconductor substrate 600 may include a conductive region, for example, an impurity-doped well or an impurity-doped structure. In addition, the semiconductor substrate 600 may have various device isolation structures, such as a shallow trench isolation (STI) structure.

In addition, the semiconductor substrate 600 may have a thickness of about 0.1 mm to about 1 mm. When the semiconductor substrate 600 is too thin, mechanical strength may be insufficient, and when the semiconductor substrate 600 is too thick, a time required for grinding may be increased, and thus, productivity of the semiconductor product may be degraded.

In some embodiments, a substructure including at least one transistor may be arranged between the semiconductor substrate 600 and the lowermost sacrificial layer 641.

The interlayer insulating layers 620 may include a plurality of interlayer insulating layers 621 to 626, the sacrificial layers 640 may include a plurality of sacrificial layers 641 to 646, and the plurality of interlayer insulating layers 621 to 626 and the plurality of sacrificial layers 641 to 646 may be alternately stacked on the semiconductor substrate 600 beginning from the lowermost sacrificial layer 641 as shown. A mask pattern MP defining positions of a plurality of openings H1 (see FIG. 10) may be formed on the uppermost one of the interlayer insulating layers 620.

The sacrificial layers 640 may be formed of a material that may be etched with an etch selectivity with respect to the interlayer insulating layers 620. That is, in a process of etching the sacrificial layers 640 using a predetermined etching recipe, the sacrificial layers 640 may be formed of a material that may be etched while minimizing etching of the interlayer insulating layers 620. This etch selectivity may be quantitatively expressed through a ratio of an etching speed of the sacrificial layers 640 to an etching speed of the interlayer insulating layers 620.

In some embodiments, the sacrificial layers 640 may include one of the materials having an etch selectivity of about 1:10 to about 1:200 for the interlayer insulating layers 620. For example, the interlayer insulating layers 620 may be any one selected from silicon oxide and silicon nitride, and the sacrificial layers 640 may be any one selected from silicon, silicon oxide, silicon carbide, and silicon nitride, and may be different from the interlayer insulating layers 620.

Meanwhile, in some embodiments, a first sacrificial layer 641 and a sixth sacrificial layer 646 may be formed to be thicker than second to fifth sacrificial layers 642 to 645. In addition, a first interlayer insulating film 621 and a fifth interlayer insulating film 625 may be formed to be thicker than second to fourth interlayer insulating films 622 to 624. However, the embodiments are not limited thereto, and thicknesses of the interlayer insulating layers 620 and the sacrificial layers 640 may be variously changed, and the number of interlayer insulating layers 620 and the number of sacrificial layers 640 may be variously changed.

Referring to FIG. 10, a plurality of openings H1 penetrating the interlayer insulating layers 620 and the sacrificial layers 640 alternately stacked may be formed using the etching apparatus 1000 (see FIG. 1) according to an embodiment of the disclosure.

The plurality of openings H1 may limit a space in which a semiconductor region is formed in the semiconductor device. The plurality of openings H1 may be trenches having a depth in the Z direction and extending in the Y direction. In addition, the plurality of openings H1 may be repeatedly formed to be spaced apart by a predetermined distance in the X direction.

In order to form the plurality of openings H1, a mask pattern MP (see FIG. 9) defining the locations of the plurality of openings H1 is formed on the interlayer insulating layers 620 and the sacrificial layers 640, which are alternately stacked, the interlayer insulating layers 620 and the sacrificial layers 640 are alternately anisotropically etched using the mask pattern MP (see FIG. 9) as an etching mask, and the mask pattern MP (see FIG. 9) is removed.

Meanwhile, in some embodiments, when the interlayer insulating layers 620 and the sacrificial layers 640 are directly formed on the semiconductor substrate 600, the plurality of openings H1 may be formed to expose a part of an upper surface of the semiconductor substrate 600 as shown. In addition, as a result of transient etching in the anisotropic dry etching process, as illustrated, the semiconductor substrate 600 under the plurality of openings H1 may be recessed to a predetermined depth.

In the process of manufacturing the semiconductor device, the operation method of the etching apparatus 1000 (see FIG. 1) according to an embodiment of the disclosure improves etching uniformity of etching the etching target layer on the semiconductor substrate 600 in a predetermined pattern by constantly maintaining the state of the process chamber 430 (see FIG. 1) by using the segmented etching process and the intermediate cleaning process in the manufacturing process facility 400 (see FIG. 1) having the plurality of process chambers 43 (see FIG. 1).

Thus, provided is an operation method of an etching apparatus and a method of manufacturing a semiconductor device, where the state of a process chamber is kept constant using segmented etching processes and intermediate cleaning processes.

Although the disclosure been described in connection with some embodiments illustrated in the accompanying drawings, it will be understood by one of ordinary skill in the art that variations in form and detail may be made therein without departing from the spirit and essential feature of the disclosure. The above disclosed embodiments should thus be considered illustrative and not restrictive.

What is claimed is:

1. An operation method of an etching apparatus, the operation method comprising:
   transferring, from a load lock chamber to a process chamber, a substrate on which an etching target layer is formed;
   first etching the etching target layer on the substrate in a first etching time;
   transferring the substrate to a storage location in a vacuum state;
   intermediate cleaning the process chamber in a first cleaning time;
   transferring the substrate from the storage location to the process chamber;
   second etching the etching target layer on the substrate in a second etching time; and
   returning the substrate to the load lock chamber,
   wherein the etching target layer is formed in an etching pattern by the first etching and the second etching.

2. The operation method of claim 1, wherein the storage location comprises a buffer chamber or a transfer chamber.

3. The operation method of claim 1, wherein each of the first etching time and the second etching time is defined based on a time series signal intensity analyzed by an optical emission spectroscopy (OES) sensor.

4. The operation method of claim 3, wherein, based on an intensity of a specific wavelength, at least one of the first etching and the second etching is performed until an absolute value change rate of about 10% to about 50% with respect to an initial intensity of the specific wavelength is detected, and
   wherein the intermediate cleaning is performed after transferring the substrate to the storage location.

5. The operation method of claim 1, wherein the first cleaning time is defined based on an intensity of a time series signal analyzed by an optical emission spectroscopy (OES) sensor.

6. The operation method of claim 5, wherein, based on an intensity of a specific wavelength in which a signal intensity decreases according to the first cleaning time, the first cleaning time is greater than or equal to a time for the intensity of the specific wavelength to reach a signal intensity of about 10% to about 30% with respect to an initial intensity of the specific wavelength.

7. The operation method of claim 1, wherein the first etching and the second etching comprise plasma etching using substantially the same process gas.

8. The operation method of claim 1, further comprising, prior to the etching target layer being etched in the etching pattern, repeating the intermediate cleaning, the transferring of the substrate from the storage location to the process chamber, and the second etching at least once.

9. The operation method of claim 8, wherein the substrate is processed while maintaining a vacuum state during the repeating of the intermediate cleaning, the transferring of the substrate from the storage location back to the process chamber, and the second etching.

10. The operation method of claim 1, further comprising, during the returning of the substrate to the load lock chamber, intermediate cleaning of the process chamber during a second cleaning time.

11. An operation method of an etching apparatus, the operation method comprising:
   transferring, from a load lock chamber to a first process chamber, a substrate on which an etching target layer is formed;
   first etching the etching target layer on the substrate in a first etching time in the first process chamber;
   transferring the substrate to a second process chamber adjacent to the first process chamber while a vacuum is maintained;
   second etching the etching target layer on the substrate in a second etching time in the second process chamber;
   intermediate cleaning the first process chamber while the second etching is being performed;
   transferring the substrate to a third process chamber adjacent to the second process chamber while a vacuum state is maintained;
   third etching the etching target layer on the substrate during a third etching time in the third process chamber;

intermediate cleaning the second process chamber while the third etching is performed; and returning the substrate to the load lock chamber.

12. The operation method of claim 11, wherein the etching target layer is formed in an etching pattern by the first etching, the second etching, and the third etching.

13. The operation method of claim 11, wherein a point in time at which the substrate is transferred to different process chambers is defined based on an intensity of a time series signal analyzed by an optical emission spectroscopy (OES) sensor.

14. The operation method of claim 11, wherein a subsequent new substrate is transferred to the first process chamber when the intermediate cleaning has been completed.

15. The operation method of claim 11, wherein each of the first etching, the second etching, and the third etching comprises plasma etching using substantially the same process gas.

16. A method of manufacturing a semiconductor device, the method comprising:

forming an etching target layer on a substrate;

forming a mask pattern on the etching target layer;

forming an etching pattern by etching the etching target layer using the mask pattern as an etching mask; and removing the mask pattern, wherein the forming the etching pattern comprises:

transferring the substrate from a load lock chamber to a process chamber;

first etching the etching target layer on the substrate in a first etching time;

transferring the substrate to a storage location in a state in a vacuum state;

intermediate cleaning the process chamber in a first cleaning time;

transferring the substrate from the storage location to the process chamber;

second etching the etching target layer on the substrate in a second etching time; and returning the substrate to the load lock chamber, and wherein the intermediate cleaning, the transferring of the substrate from the storage location to the process chamber, and the second etching are repeated at least once until the etching target layer is etched in the etching pattern.

17. The method of claim 16, wherein the etching pattern is formed to include a high aspect ratio contact hole.

18. The method of claim 17, wherein the first etching and the second etching increase a uniformity of a diameter of the opening of the high aspect ratio contact hole.

19. The method of claim 16, wherein each of the first etching time and the second etching time is defined based on an intensity of a time series signal analyzed by an optical emission spectroscopy (OES) sensor.

20. The method of claim 19, wherein, based on an intensity of a specific wavelength, at least one of the first etching and the second etching is performed until an absolute value change rate of about 10% to about 50% with respect to an initial intensity of the specific wavelength is detected, and wherein the intermediate cleaning is performed after transferring the substrate to the storage location.

* * * * *